United States Patent [19]

Klatskin

[11] 3,897,627

[45] Aug. 5, 1975

[54] METHOD FOR MANUFACTURING SEMICONDUCTOR DEVICES

[75] Inventor: Jerome Barnard Klatskin, Princeton Junction, N.J.

[73] Assignee: RCA Corporation, New York, N.Y.

[22] Filed: June 28, 1974

[21] Appl. No.: 484,084

[52] U.S. Cl. ....................... 29/578; 29/580; 29/583; 29/591

[51] Int. Cl.$^2$ ............................................ B01J 17/00

[58] Field of Search .............. 29/578, 580, 583, 591

[56] References Cited

UNITED STATES PATENTS

| | | | |
|---|---|---|---|
| 3,720,997 | 3/1973 | Black | 29/583 |
| 3,795,045 | 3/1974 | Dumas | 29/580 |
| 3,805,376 | 4/1974 | D'Asaro | 29/580 |
| 3,820,236 | 6/1974 | Haitz | 29/580 |

*Primary Examiner*—W. Tupman

*Attorney, Agent, or Firm*—Glenn H. Bruestle; William H. Murray

[57] ABSTRACT

A metal film is deposited on one side of a wafer of semiconductor material. A plurality of device regions are formed on the metal film by intersecting strips of a masking material. A layer of metal is plated on the metal film within each device region. The other side of the semiconductor wafer is selectively etched down to the metal film to form an array of semiconductor devices, each device being positioned within the boundaries of a corresponding device region. The devices are then separated from the array by fracturing the metal film along the strips of masking material.

3 Claims, 9 Drawing Figures

METHOD FOR MANUFACTURING SEMICONDUCTOR DEVICES

The invention herein described was made in the course of or under a contract or subcontract thereunder with the Department of the Army.

BACKGROUND OF THE INVENTION

This invention relates generally to dicing techniques for semiconductor materials and, more particularly, to an improved method for dicing a semiconductor wafer into individual semiconductor devices of desired geometrical configuration.

The dicing of semiconductor wafers, which are thin wafers cut from an ingot of single crystal material, such as silicon or germanium or the like, is well known in the art. Typical methods which have been used in the past are dicing with a diamond saw; ultrasonic dicing; sandblast dicing; etched dicing; laser dicing; and scribe and break dicing.

The principal problem associated with these methods, in addition to the expense of the equipment involved in performing the dicing, includes low yields due to damage along the edges of the resultant devices which is caused by the various scribing, sawing and etching techniques as well as inadvertent fractures of the device itself. These inadvertent fractures may result from the failure to sufficiently scribe or etch the proposed fracture lines. These fracture lines have generally heretofore been defined in the semiconductor material itself.

SUMMARY OF THE INVENTION

A method of manufacturing semiconductor devices includes the steps of first, depositing a thin metal film on one side of a wafer of semiconductor material. Next, intersecting strips of a masking material are formed on the metal film to define device region boundaries. A metal layer is then applied to the metal film within each device region between the strips of masking material. Next, an array of semiconductor devices is formed on the other side of the semiconductor wafer by a process which includes etching away the semiconductor material from around each semiconductor device in the array down to the thin metal film. The resultant product at this point in the process is an array of semiconductor devices attached to each other by a thin metal film along lines which are defined by the strips of masking material. As a result, a minimal force applied to the devices in the array will cause the thin metal film to fracture along these lines thereby permitting individual devices to be separated from the array.

DETAILED DESCRIPTION

Although the detailed description of the preferred embodiment of the method of this invention presented herein relates to the manufacturing of a plurality of diodes, this method has applicability to the manufacture of any type of semiconductor device which is formed on a wafer of a semiconductor material, such as silicon or germanium.

Figure 1:
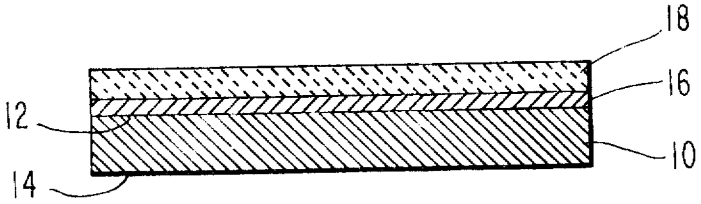
FIG. 1 is a sectional view showing some of the steps of manufacturing a plurality of semiconductor devices in accordance with the invention disclosed herein.

Referring initially to FIG. 1, there is shown a wafer 10 of a semiconductor material such as silicon, having a first side 12 and a second side 14. In this particular embodiment of the method of the invention disclosed herein, the semiconductor wafer 10 is diffused with a doping substance in order to form the desired devices. After the doping process is completed, a first metal film 16 is deposited on the surface of the first side 12 of the semiconductor wafer 10 using standard deposition techniques such as vacuum, sputtering, or ion beam for example. This first metal film 16 can be a mixture of titanium-palladium-gold or chrome-gold or any metallic substance which forms a good bond with the surface of the semiconductor wafer. The thickness of the first metal film 16 is typically on the order of 4000 A.

Figure 2:
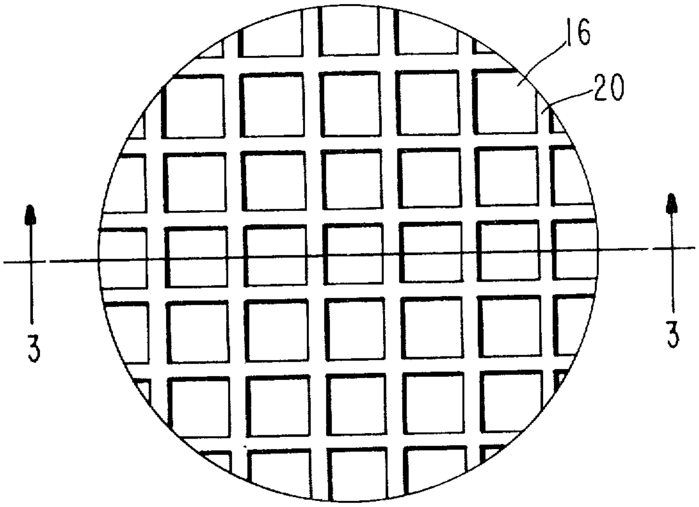
FIG. 2 is a plan view of the one side of a semiconductor wafer showing a square pattern formed thereon.
Figure 3:
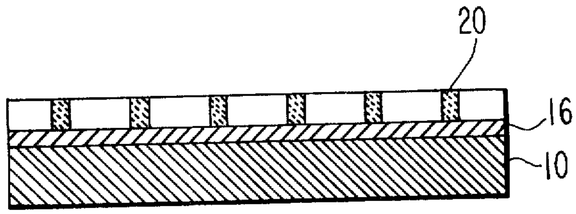
FIGS. 3, 4 and 5 are sectional views showing further steps of manufacturing a plurality of semiconductor devices in accordance with the invention disclosed herein.

After deposition of the first metal film 16, a layer of a photosensitive masking material 18, such as dyanachem index HS, is applied to the first metal film 16 using standard photoresist application techniques. Typically this layer has a thickness on the order of 7–8 mils. Note that although not a mandatory requirement, it is desirable that photosensitive masking material possess at least a minimal amount of tackiness or adhesive quality. The reason for this will become apparent later on in the detailed description. Next, the photosensitive masking layer 18 is exposed to a square mesh pattern of light which defines a plurality of squares, each being approximately 60 mils on a side with a spacing of approximately 10 mils between squares. The photosensitive masking material is developed and the unexposed areas are washed away leaving the exposed material in the shape of interacting strips 20 formed on the first metal film 16 as shown in FIG. 2. Each strip 20 has a width substantially equal to 10 mils and a height of 7–8 mils. It is to be noted here that, although the previous steps have been described using a negative photosensitive masking material, these steps can be equally well carried out using a positive photosensitive masking material and such an embodiment is to be considered within the scope and contemplation of this invention. FIG. 3 is a sectional view taken along line 3—3 of FIG. 2 and shows the strips of exposed photosensitive masking material 20 formed on the first metal film 16.

Figure 4:
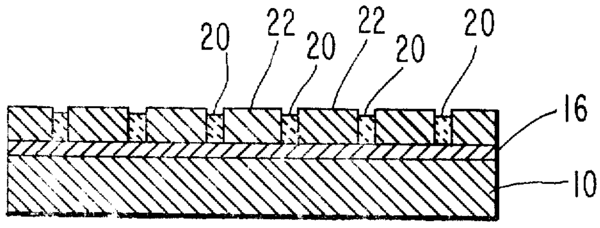

Referring to FIG. 4, a layer 22 of a metal having good thermal and electrical conductivity, such as copper, is applied to the first metal film 16 within each area defined by the strips 20 of exposed photosensitive masking material. These layers are applied using standard electroplating techniques and are plated to a thickness which is substantially equal to the height of the strips of photosensitive material 20 which is approximately 7–8 mils. Note that, although the nominal thickness of the metal layers 22 is not critical, they should not be plated so thick as to allow overhang and consequent joining of adjacent metal layers over the strips 20.

Figure 5:
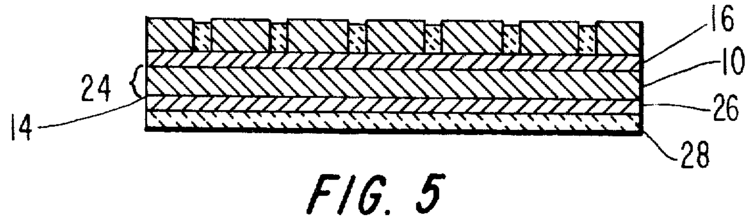

Next, as indicated by the reference numeral 24 in FIG. 5, the semiconductor material on the second side 14 of the wafer 10 is etched down to a thickness of approximately 1 mil. A second metal film 26 is then deposited on the second side 14 of the semiconductor wafer 10 using standard deposition techniques such as vacuum, sputtering, or ion beam for example. The composition of the second metal film 26 may be the same as that of the first metal film 16, that is, a mixture of titanium-palladium-gold or chrome-gold or any metallic substance which forms a good bond with the surface of the semiconductor wafer 10. The thickness of the second metal film 26 is typically on the order of 4000 A.

Figure 6:
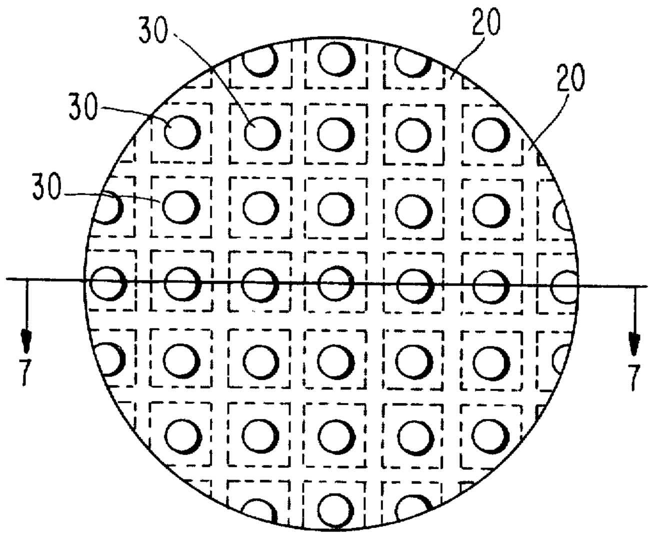
FIG. 6 is a plan view of the other side of the semiconductor wafer showing a pattern of dots formed thereon.
Figure 7:
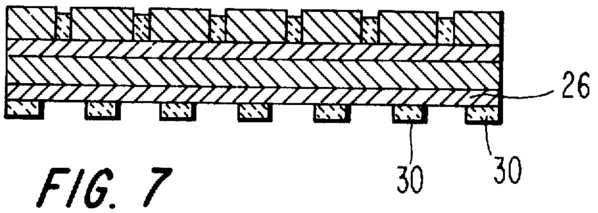
FIGS. 7 and 8 are sectional views showing further steps of manufacturing a plurality of semiconductor devices in accordance with the invention disclosed herein.

A layer of photosensitive etch resistant material 28 is then applied to the second metal film 26. This layer 28 is exposed to a light pattern comprising an array of dots. This array is aligned such that each individual dot is located substantially within a square, the boundaries of which are defined by the photosensitive masking strips 20 which are formed on the first metal film 16 and which are indicated by dotted lines in FIG. 6. The diameter of each dot is typically about 30 mils. The layer 28 is then developed and the unexposed areas washed away leaving the exposed photosensitive etch resistant material in the form of an array of dots 30 which conforms to the applied light pattern. Again it is to be noted that although the preceding steps are described using a negative photosensitive etch resistant material, a positive photosensitive etch resistant material may also be used and consequently is within the scope and contemplation of this invention. FIG. 7 is a sectional view taken along line 7—7 of FIG. 6 which shows the dots 30 of exposed photosensitive etch resistant material remaining on the second metal film 26.

Figure 8:
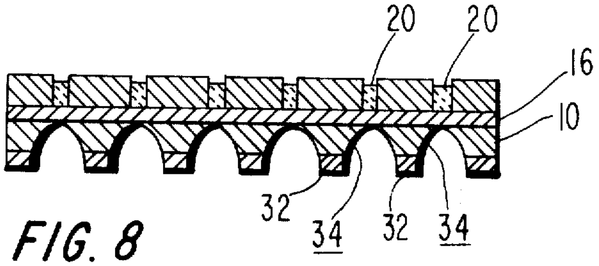

Next, the second metal film 26 is etched away leaving an array of metallic dots 32, each of which is covered by a dot 30 of photosensitive etch resistant material. The dots 30 are then dissolved leaving the array of metallic dots 32 exposed as shown in FIG. 8. The semiconductor material surrounding the array of metallic dots 32 is then etched away down to the first metal film 16. This procedure results in a plurality of semiconductor devices generally designated as 34 in FIG. 8 which are attached to one another by the first metal film 16, which is approximately 4000 A. in thickness, as well as the adhesive qualities of the exposed photosensitive masking strips 20. As stated previously, it is desirable, but not mandatory, to use a photosensitive masking material having at least a minimal amount of adhesive qualities since this adhesiveness can effectively function to provide additional connective support between devices in the array. Each device may now be broken away from the array by simply holding the device with a pair of tweezers and breaking it along the boundaries formed by the first metal film and the layer of exposed photosensitive masking material. Of course, the use of tweezers is merely illustrative and any more or less sophisticated tool or equipment may be used to separate each device from the array.

Figure 9:
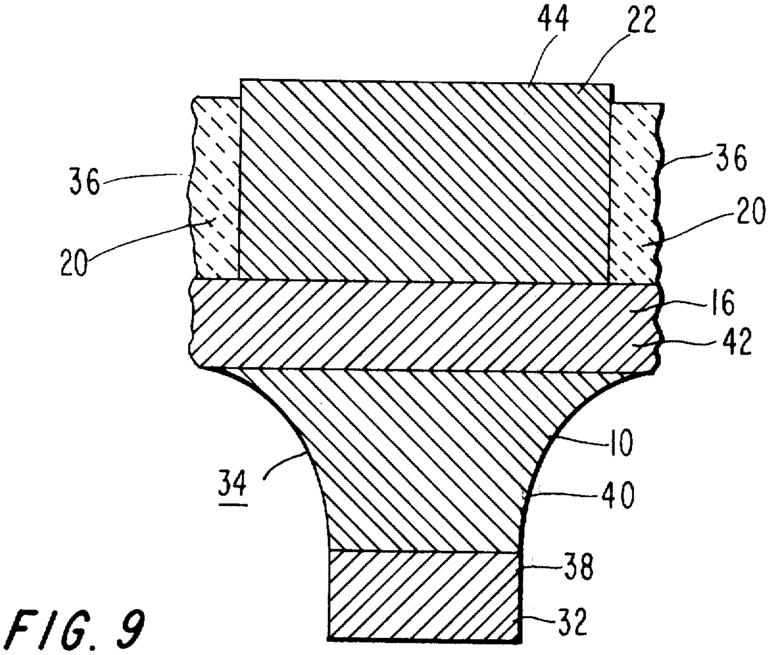
FIG. 9 is an enlarged sectional view of a single resultant semiconductor device produced by the method of the invention disclosed herein.

FIG. 9 is an enlarged sectional view of a semiconductor device 34 which has been broken away from an array prepared in accordance with the method of this invention. The lines of fracture 36 occur in the relatively soft photosensitive masking strips 20 as well as in the relatively thin first metal film 16. When broken away from the array, each semiconductor device of the embodiment described herein includes a first electrode 38 which is formed by a metallic dot 32; a junction region 40 which comprises that portion of the semiconductor material 10 which remains after etching; a second electrode 42 which comprises a portion of the first metal film 16; and a heat sink 44 which comprises a metal layer 22 which was plated on the first metal film 16 between the strips 20 of photosensitive masking material. Note that the metal layer 22 serves at least three functions in the process described herein. First, it serves to carry heat away from the junction region 40 during operation of the device. Second, because of its relative thickness, typically 7–8 mils, the metal layer 22 provides structural support for the device during handling. Third, again due to its relative thickness, it serves to cause separation of the device from the array to occur along the lines defined by the strips 20 of photosensitive masking material. The reason for this being that when the separation force is applied, the relatively thin, approximately 4000 A., first metal film 16 will fracture in those areas which have not been plated with the metal layer 22. Consequently, the size of the separated device will conform to the size of the plated metal layer 22 which in turn can be controlled by the layout of the photosensitive masking strips 20 on the first metal film 16.

I claim:

1. A method of manufacturing semiconductor devices comprising the following steps;

a. depositing a first metal film on one side of a wafer of semiconductor material having opposed sides;
b. forming on said first metal film intersecting strips of a masking material to define device region boundaries;
c. applying a metal layer to said first metal film within said boundaries of each device region;
d. removing portions of the other side of said semiconductor wafer in order to form an array of semiconductor devices, each device being located within an area on said other side which is subtended by the boundaries of a corresponding device region;
e. separating the devices from the array along the strips of masking material to obtain a plurality of individual semiconductor devices.

2. A method in accordance with claim 1 wherein said device region boundaries are defined by:

a. applying a layer of photosensitive material on the first metal film;
b. exposing the photosensitive material to a source of electromagnetic radiation having a substantially rectangular grid pattern;
c. removing the unexposed portions of the photosensitive material leaving the first metal film having a plurality of strips thereon which intersect at substantially right angles.

3. A method in accordance with claim 2 in which the array of semiconductor devices is formed by:

a. depositing a second metal film on the other side of the semiconductor wafer;
b. etching away the second metal film leaving an array of metallic dots, each dot being located within an area on said second metal film which is coterminous with the boundaries of a corresponding device region;
c. etching away the semiconductor material from around the metallic dots down to the first metal film, leaving an array of mesa-like structures of semiconductor material formed on the first metal film.

* * * * *